(12) United States Patent
Jain et al.

(10) Patent No.: US 12,517,467 B2
(45) Date of Patent: Jan. 6, 2026

(54) TIME-TO-DIGITAL CONVERTER-BASED DEVICE

(71) Applicant: NATIONAL UNIVERSITY OF SINGAPORE, Singapore (SG)

(72) Inventors: Samarth Jain, Singapore (SG); Kah-Wee Ang, Singapore (SG); Sifan Li, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 148 days.

(21) Appl. No.: 18/382,706

(22) Filed: Oct. 23, 2023

(65) Prior Publication Data

US 2024/0134319 A1 Apr. 25, 2024
US 2024/0231282 A9 Jul. 11, 2024

(30) Foreign Application Priority Data

Oct. 21, 2022 (SG) .......................... 10202251457C (51) Int. Cl.
*G04F 10/00* (2006.01)
*G04F 10/10* (2006.01)

(52) U.S. Cl.
CPC ............ *G04F 10/005* (2013.01); *G04F 10/10* (2013.01)

(58) Field of Classification Search
CPC ...... G04F 10/005; G04F 10/10; H04L 41/046; H04L 41/40; H04L 41/5051; H04L 41/5058; H04L 67/51
See application file for complete search history.

(56) References Cited

U.S. PATENT DOCUMENTS

| | | | | |
|---|---|---|---|---|
| 2001/0045856 | A1* | 11/2001 | Ooishi | H03K 5/133 327/277 |
| 2012/0038402 | A1* | 2/2012 | Takahashi | H03L 7/0995 327/158 |
| 2014/0368372 | A1* | 12/2014 | Kim | H03M 1/002 341/166 |
| 2019/0372575 | A1* | 12/2019 | Wu | H03L 7/0893 |
| 2022/0027130 | A1* | 1/2022 | Kashmiri | G06N 3/048 |

* cited by examiner

*Primary Examiner* — Omer S Khan
(74) *Attorney, Agent, or Firm* — HARNESS, DICKEY & PIERCE, P.L.C.

(57) ABSTRACT

Disclosed is a time-to-digital converter (TDC)-based device comprising a crossbar array for generating a current, a current-controlled delay line 104 for converting the current received from the crossbar array into a time pulse, and a TDC circuit 106 for measuring and converting the time pulse into digital output.

4 Claims, 11 Drawing Sheets

TIME-TO-DIGITAL CONVERTER-BASED DEVICE

CROSS-REFERENCE PARAGRAPH

This application claims priority from Singapore Patent Application No. 10202251278Y, filed on Oct. 21, 2022. The entire disclosure of the above application is incorporated herein by reference.

TECHNICAL FIELD

The present invention relates, in general terms, to a time-to-digital converter (TDC)-based device. More particularly, the present invention relates to a TDC-based device for computing and storage.

BACKGROUND

The rapid development of artificial intelligence (AI), Internet-of-Things (IoT), and parallel computing put significant demands on efficient peripheral circuits. Sense circuits are one of the bottlenecks in parallel computing hardware such as crossbar neural networks. Each parallel branch requires an analogue-to-digital converter (ADC), and hence multiple branches with ADC are not scalable due to power and area demand.

A scaling roadblock also exists with using ADCs due to their complexity in applications like parallel computing, where power consumed by ADCs is a limiting factor. This scaling issue is much more severe in AI processors, where the number of parallel feature extraction units is exploding and is directly proportional to the number of sense circuits.

It would be desirable to overcome or ameliorate at least one of the above-described problems, or at least to provide a useful alternative.

SUMMARY

TDC-based devices disclosed herein relate are based on time to digital converter (TDC) circuits and, in particular, such circuits as are suitable for crossbar-based circuits for computing and storage. Such circuits can be used in Memristor, Memtransistor, ferroelectric capacitor (FeCAP) or ferroelectric transistor (FeFET) based crossbar computing and storage device arrays.

Sense circuit architectures presented herein significantly relax power and area demand. The circuit can be used with crossbar Memristor/Memtransistor/FeCAP/FeFET chips for AI and storage applications beyond Moors law applications. This can help alleviate tradeoffs for battery-powered intelligent systems like autonomous cars, drones, and medical devices.

Disclosed herein is a time-to-digital converter (TDC)-based device comprising a crossbar array for generating a current, a current-controlled delay line 104 for converting the current received from the crossbar array into a time pulse, and a TDC circuit 106 for measuring and converting the time pulse into digital output.

The devices described herein, particularly when compared with traditional ADC circuits, have lower power consumption and lower latency, as well as a higher sensing margin.

BRIEF DESCRIPTION OF THE DRAWINGS

Embodiments of the present invention will now be described, by way of non-limiting example, with reference to the drawings in which.

DETAILED DESCRIPTION

Disclosed are TDC circuits that can be used in crossbar-based circuits for computing and storage. Such circuits are suitable for Memristor, Memtransistor, ferroelectric capacitor (FeCAP) or ferroelectric transistor (FeFET) based crossbar computing and storage device arrays.

Conventionally, von Neumann architecture utilizes separate processing (i.e., digital multiplier) and memory (i.e., static random access memory (SRAM)) units. This results in a large footprint size and high energy consumption during data transport. Non-volatile memory crossbar arrays (CBA) are proposed herein as a potential solution to overcome such challenges due to the smaller footprint (4F2) and capability for in-memory computing.

Another scaling bottleneck is power efficiency. This is especially the case for the conventional ADC-based sensing circuits. To improve power efficiency and computing parallelism, device 100 of FIG. 1, image (a), employs a time-domain sensing circuit for CBA-based in-memory computing architectures.

Device 100 is a TDC device that can be used for computing and storage. The device 100 includes a crossbar array 102, or a set of crossbar arrays, for generating a current, a current-controlled delay line (see FIG. 1, image (c)) for converting the current received from the crossbar array into a time pulse, and a TDC circuit 106 for measuring and converting the time pulse into digital output.

Figure 1:
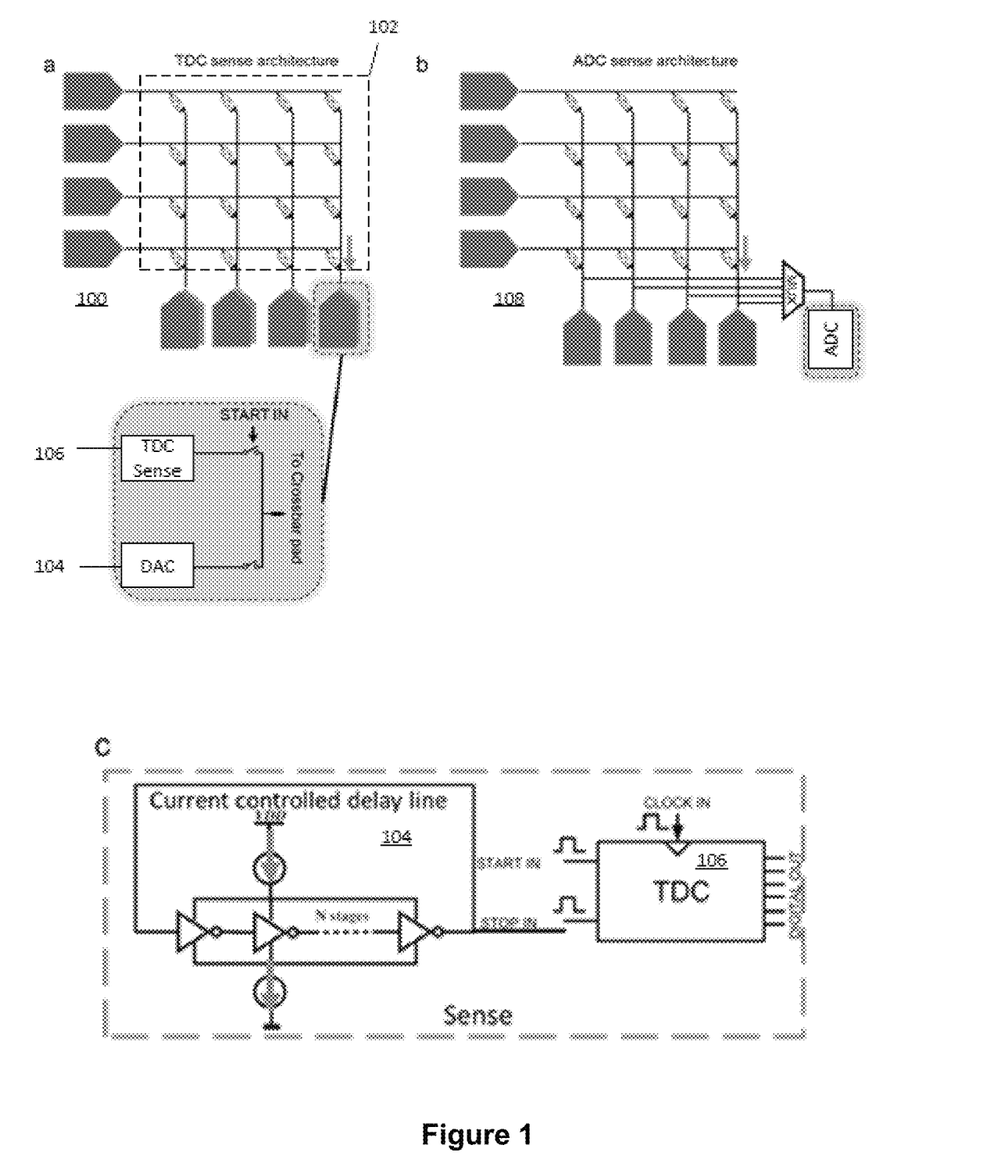
FIG. 1 is a comparison between conventional crossbar sense architecture and proposed TDC based sensing architecture for compute and storage.

FIG. 1, images (a) and (b) compare a conventional crossbar sense architecture 108 and the proposed TDC based sensing architecture 100 for compute and storage. The conventional ADC architecture 108 indirectly senses current after current to voltage conversion by integrators.

FIG. 1, image (c), shows the TDC sense circuit in more detail. The current controlled delay line 104 receives current from CBA 102 as input and produces a time pulse as output. This time pulse is read out by TDC 106.

The schematic diagram in FIG. 1, image (c), illustrates how the proposed sensing circuit 100 is different from conventional ADC applications in CBA 108 sensing for compute and storage. The read architecture in CBA 108 generally employs a 7-8 bits successive approximation register (SAR) ADC, but it requires a current integrator for current to voltage conversion. Even worse, CBA has typically high output current in ~mA as it uses Kirchhoff's current law for multiplier accumulator (MAC) operations. This makes frequency domain ADC a power hungry architecture. To save power, the conventional ADC-based circuit 108 multiplexes the ADC to save power but, in doing so, sacrifices parallel computing. Direct current-to-time conversion is essential for high-speed, low power computing applications. Additionally, SAR ADC needs significant power (~3.1 mW) per ADC channel.

The circuit 100 can be one of multiple devices brought together in a system that converts direct current to the time domain using the current-controlled delay lines. Those current controlled delay lines may have any appropriate circuitry—in some embodiments, the current controlled delay lines use cascaded metal oxide (MOS) inverters, such as complementary MOS (CMOS). The output time is measured by the TDC converter circuit 106. The TDC 106 helps eliminate the current to voltage conversion process, and high current from CBA helps in fast readout by TDC. Additionally, the digital nature of current-controlled delay lines and TDC makes the proposed design highly scalable with CMOS technology, while using minimal analog components. The sense architecture can therefore be used in scalable parallel readout applications like 1T1R and 1S1R crossbars and others, particularly those suitable for AI applications and high-density storage.

The architecture 100 performs time encoding after multiplication and addition of final array output from collective devices. This is more efficient and lowers latency when compared with performing the same operations on the output of a single device. The architecture 100 report voltages pulses as input to the crossbar array, and provides a non-linear sense output.

Using a TDC sense circuit 106 for parallel crossbar array computing has lower power requirements compared to frequency domain ADC. Crossbar arrays generally used in dense AI chip architectures are power hungry parallel computing devices. In the TDC architecture proposed in FIG. 1, Image (a), conversion occurs by storing and releasing the same energy for one time instance, using capacitors, CMOS capacitances, parasitic delays and others as will be apparent to the skilled person in view of present teachings. In contrast, frequency domain ADC wastes energy across multiple sampling cycles.

Advantageously, the present architecture 100 has lower latency than ADC architectures due to the direct current readout scheme compared to frequency domain readout used in conventional ADC. Direct current-based TDC has a higher readout speed compared to ADC frequency-domain readout, which is particularly useful for real-time compute and storage applications. The present embodiments can provide latency as low 10 ns as its instant conversion, or one clock period of digital current or any other measure that will be appropriate to the skilled person in view of present teachings.

Advantageously, embodiments of the present architecture use a current subtractor to enhance the sensing margin. This is particularly user in crossbar arrays like 1S1R or 1T1R, due to sneak current and leakage from periphery, to maintain the sensing margin.

Figure 2:
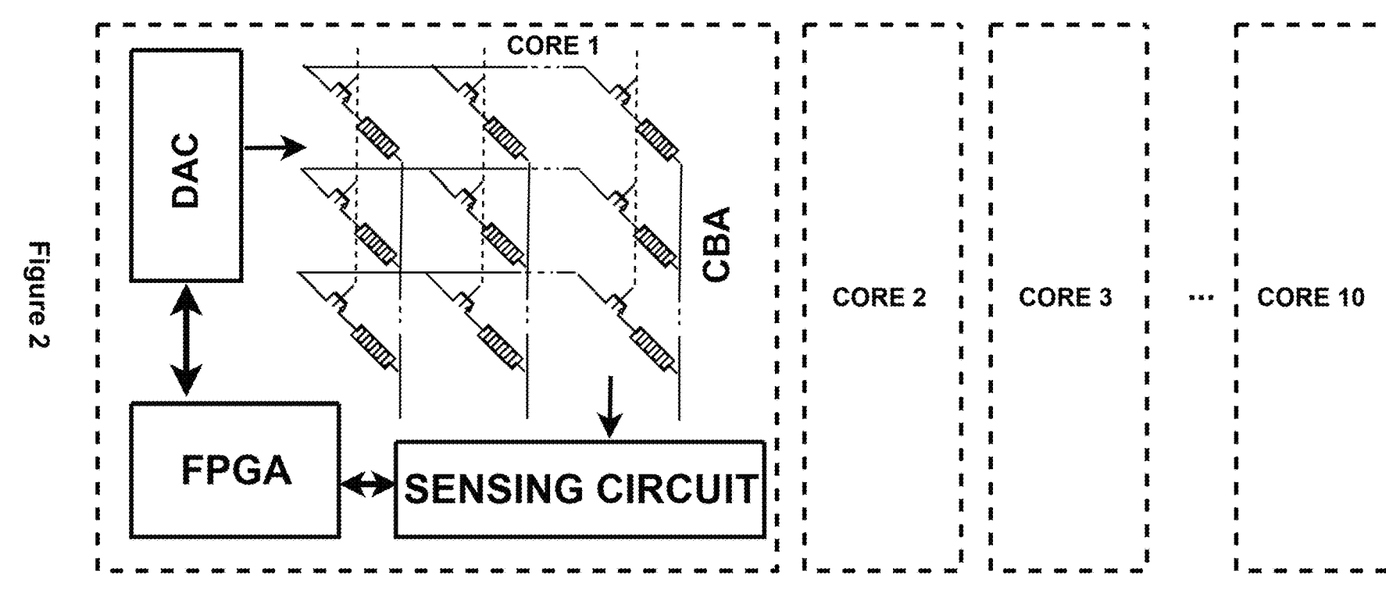
FIG. 2 demonstrates a crossbar array accelerator on a printed circuit board (PCB)

FIG. 2 presents a demonstration PCB for the proposed sensing circuit. FIG. 2 shows an example of a crossbar array accelerator using the present teachings. It consists of DACs, FPGA, a CBA die, and the sensing circuit. The FPGA controls the DAC voltage timing, parallel TDC counters, contains data transfer protocols like USB, serial interface, and memory blocks like SRAM to store final results. The sensing circuit consists of 16 cards for sensing 32 columns in parallel. Each card contains a current subtraction unit along with current controlled delay line for current to time conversion. FPGA implements TDC and further data handling. The hardware can perform image processing, video processing, and other basic operations like MAC (multiply and accumulate).

The Cross Bar Array (CBA) die is wire bonded at the center of PCB. The current sensing circuit is located at the bottom. Each card controls a pair of columns in an array. Hence for 32 columns, we need 16 cards.

Figure 3A:
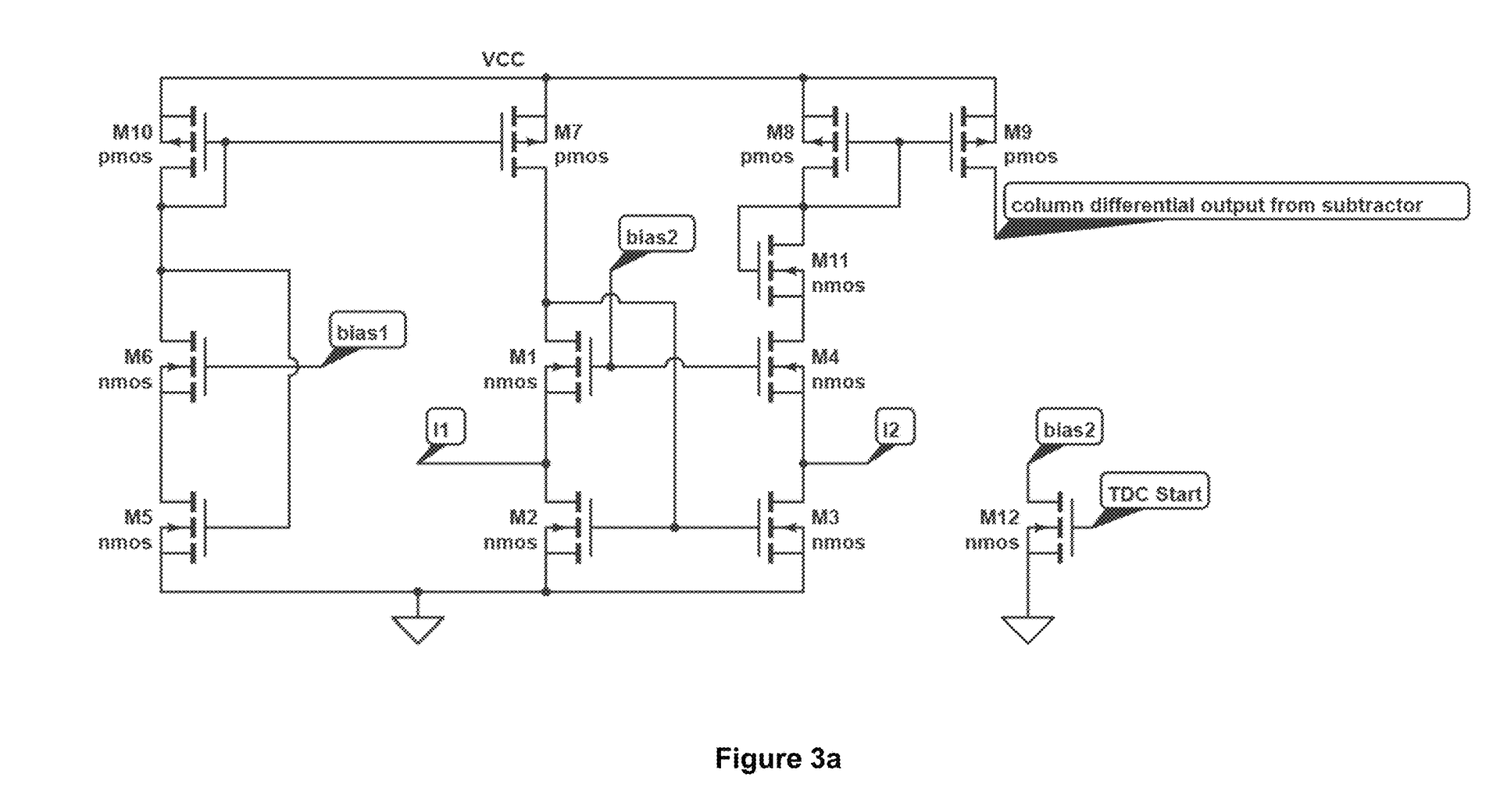
FIG. 3 is a circuit diagram demonstrating a sense circuit in accordance with present teachings.

In experiments performed using the circuit shown in FIG. 2, the output currents from two columns of the CBA (i.e., I1 and I2) are fed to a current subtraction unit. As shown in FIG. 3, image (a), an example input current subtraction stage 300 for column differential operations on CBA is provided. The circuit or stage 300 consists of two input current subtraction 300 for column differential to increase sensing margin. This step is very useful in high-density CBA to overcome device-to-device leakage and nonlinearity. Current subtraction is gated (M1 and M4) and is allowed when a Start signal is triggered.

Figure 3B:
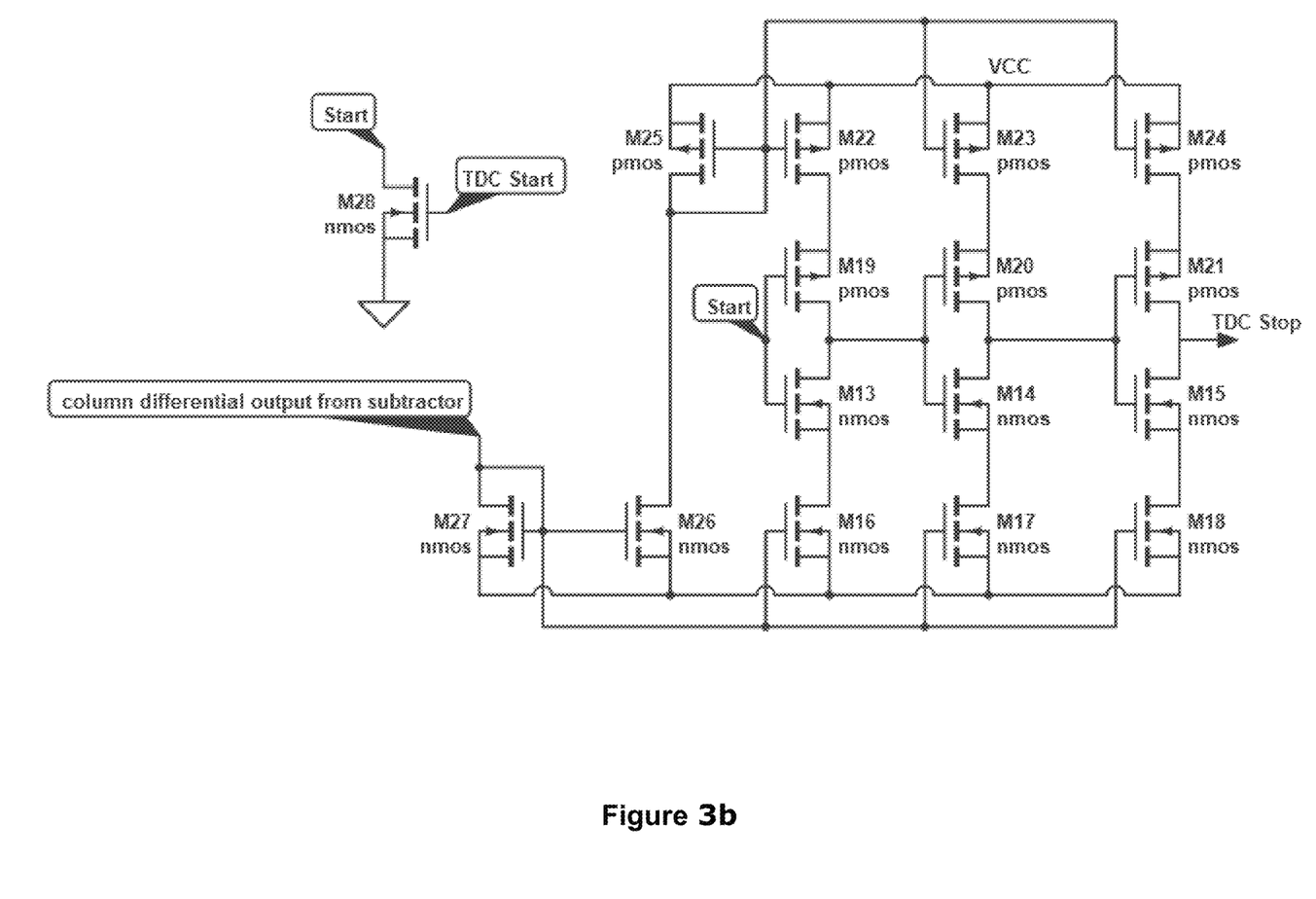

The current subtracted is input to the current controlled delay line 302 shown in FIG. 3, image (b). The current controlled delay line is used for current to time conversion. The current controlled delay line is initialized using M28 with Start signal. The propagation of Start signal across delay line is nonlinearly related to input subtracted current. Hence current is converted to the time domain. Once time conversion is complete by delay line, TDC Stop pulse is set.

Figure 3C:
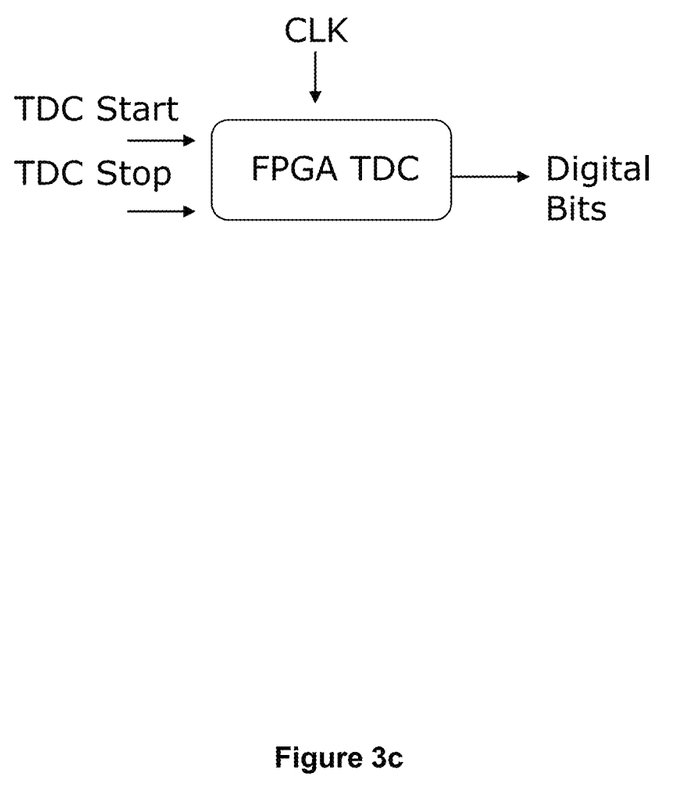

The output time between start and stop is read by TDC counter 304 shown in FIG. 3, image (c). There is direct current to time conversion, unlike conventional ADC, which is beneficial for high-speed, low-latency computation required in AI applications. Additionally, low latency is achieved by first pulse sampling in time domain by FPGA counter 304, unlike multiple sampling done in conventional ADC.

Figure 4:
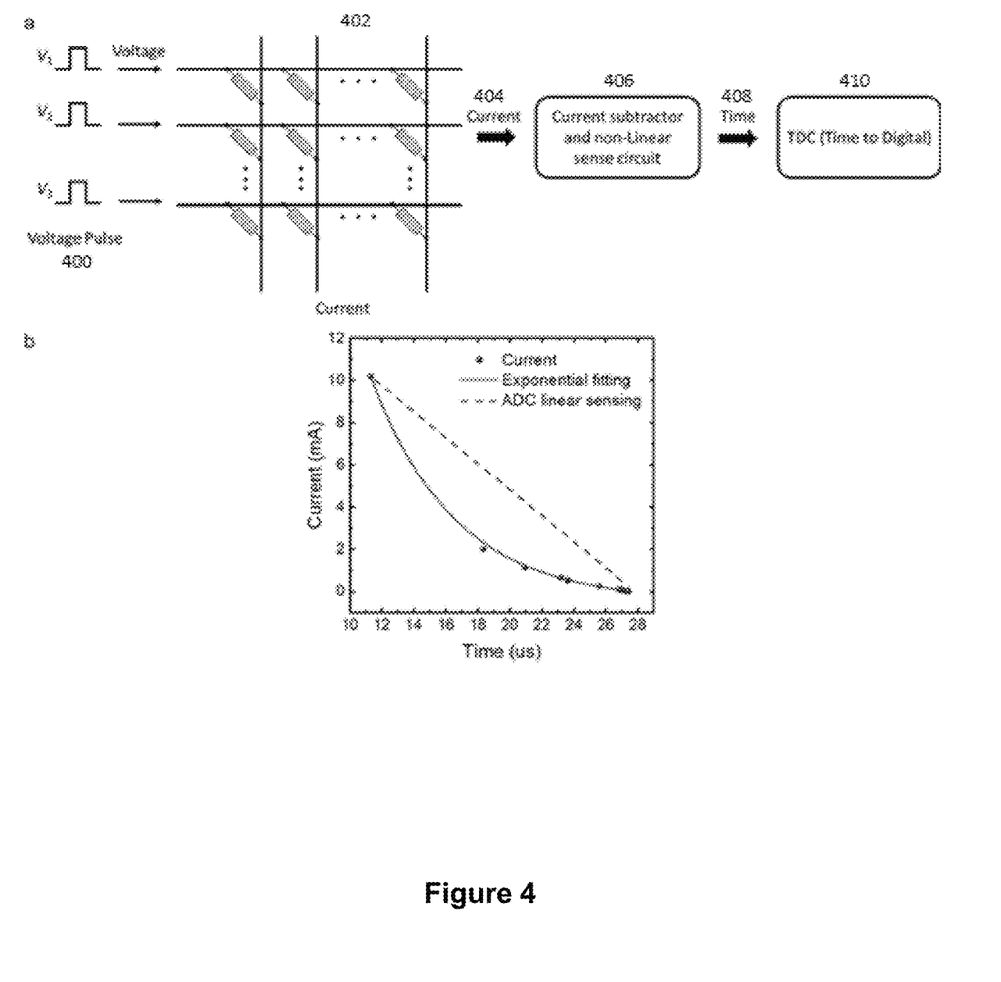
FIG. 4 shows the measured output from TDC.
Figure 5A:
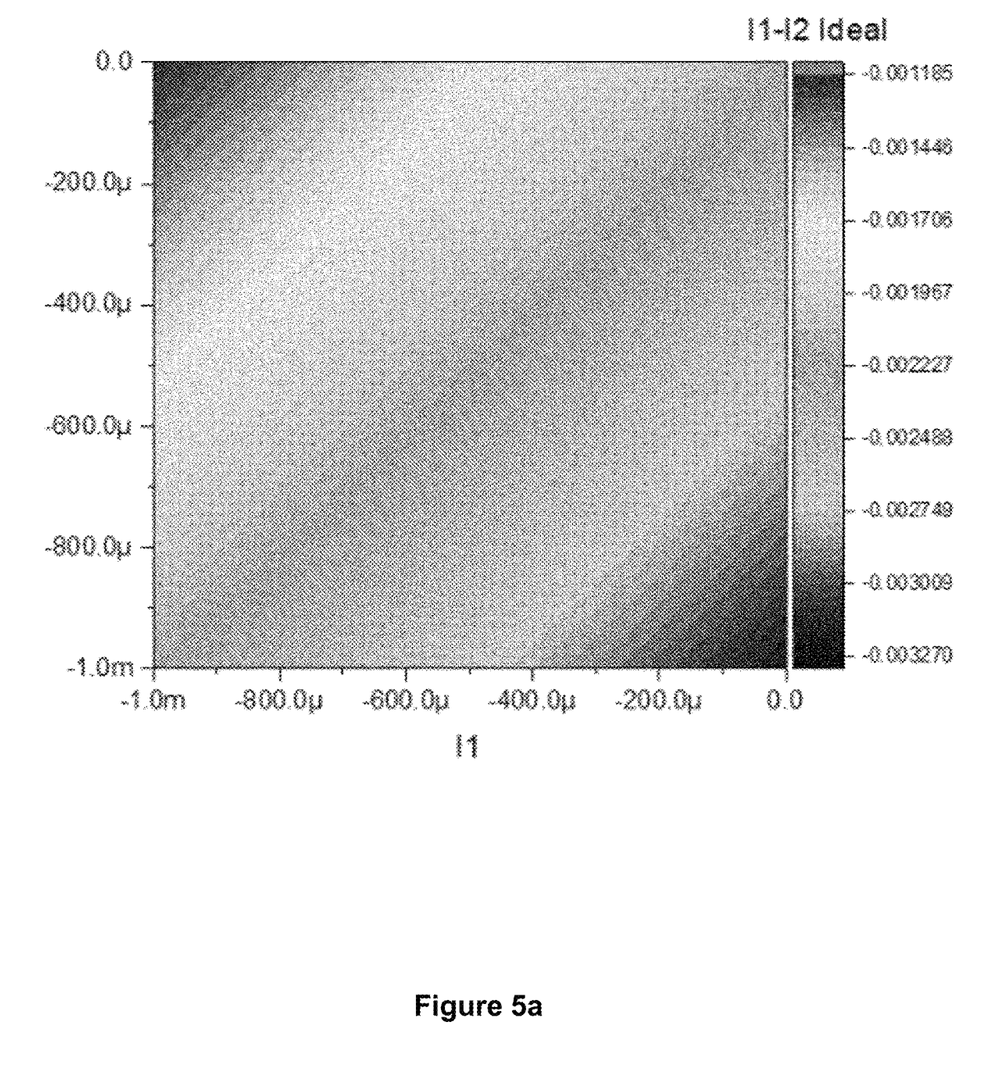
FIG. 5 provides the current subtraction PCB measurements.
Figure 5B:
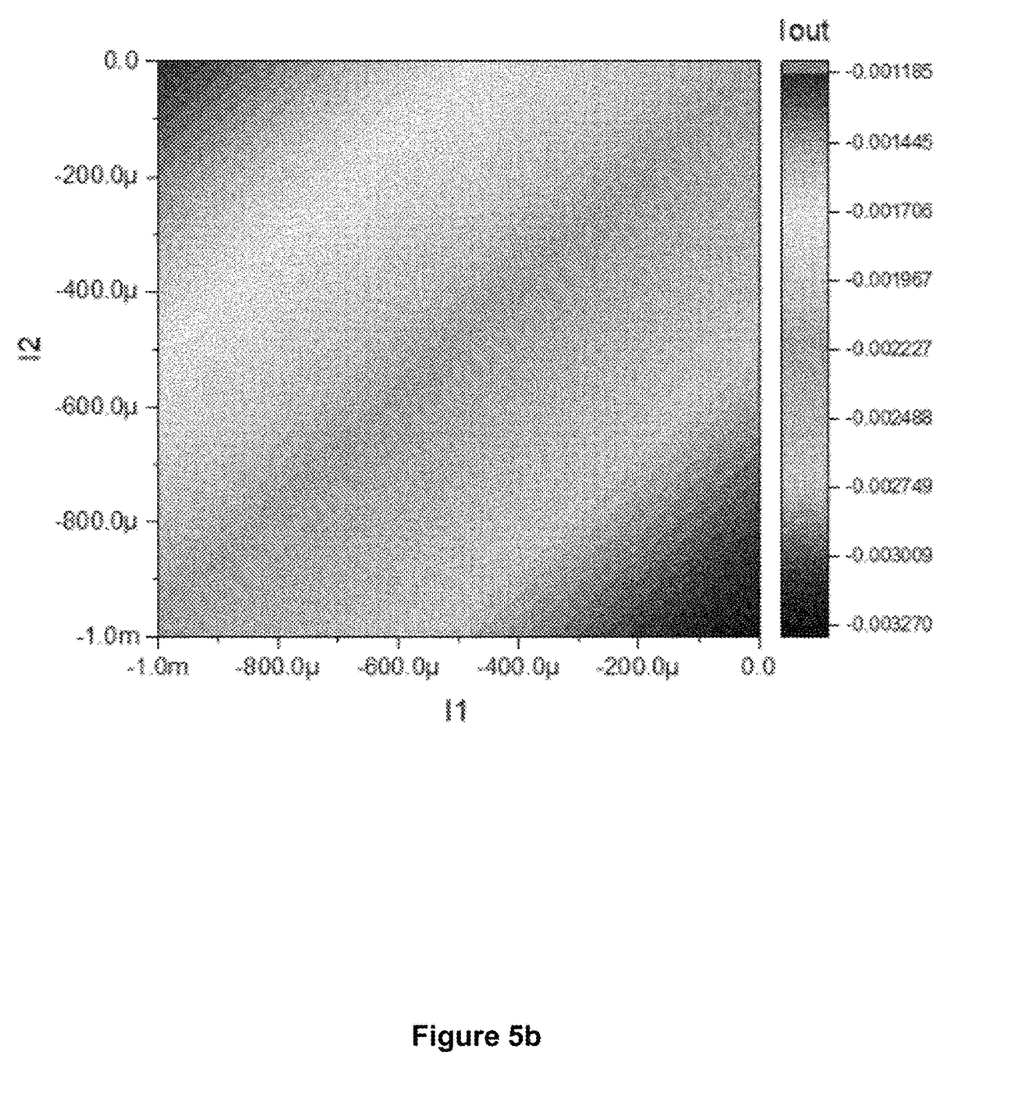
Figure 5C:
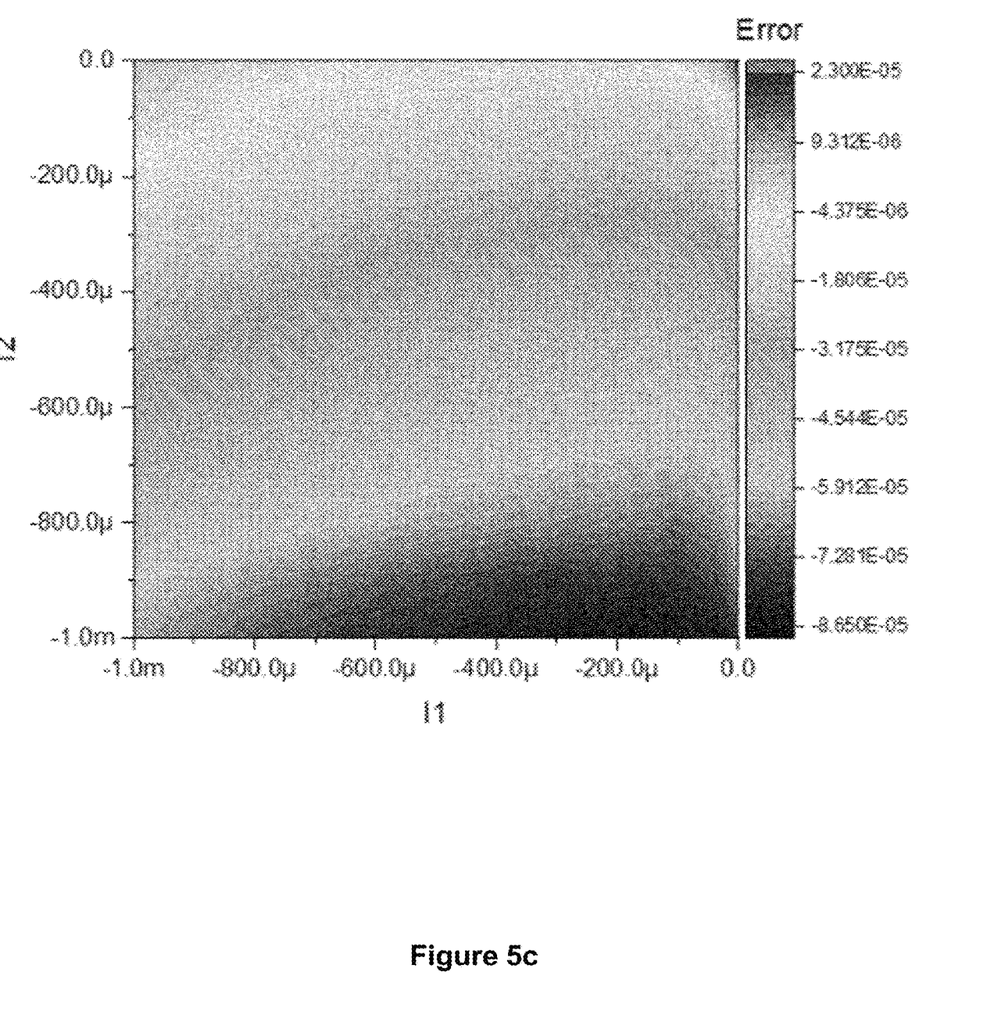
Figure 5D:
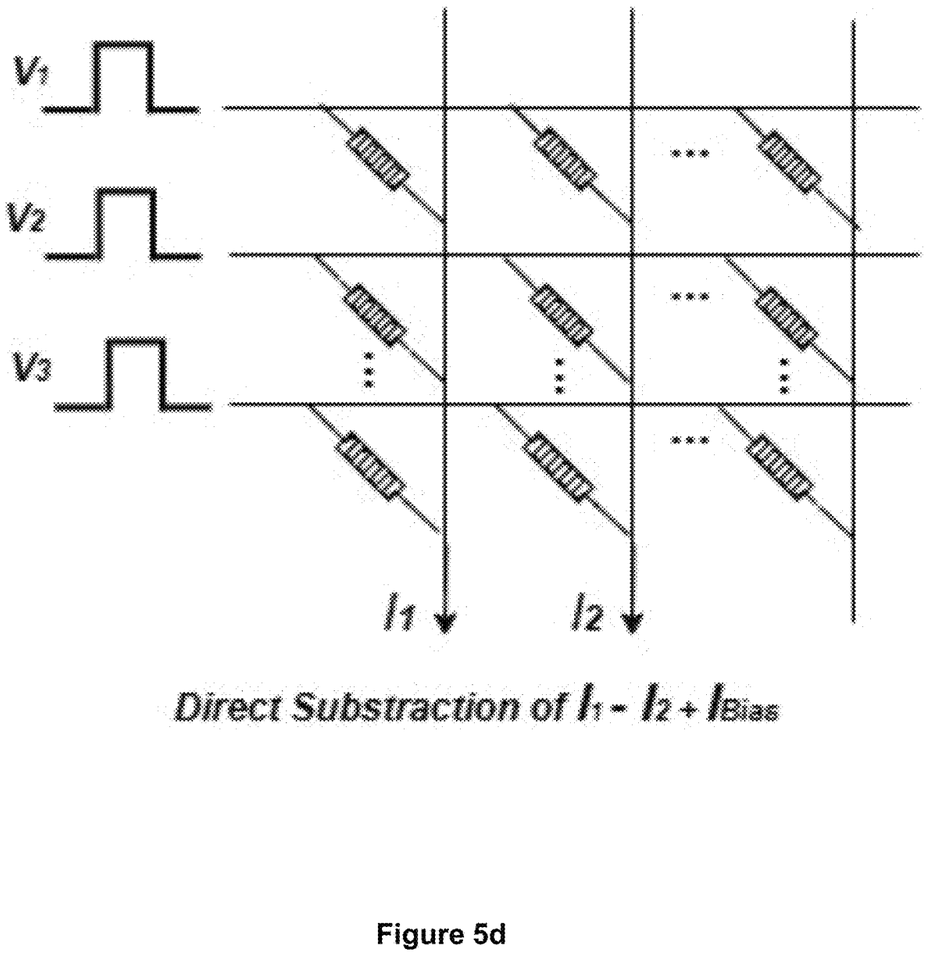

FIG. 4, image (a), schematically describes the processes converting input voltage pulses to a TDC signal. This illustrates the complete flow of signals from input to CBA and final output from TDC. In this signal flow, voltage pulses 400 are input to CBA 402. CBA 402 outputs the current computation output. The output current 404 from the columns of CBA 402 is fed to low impedance analog subtraction circuit in unit 406. Unit 406 also includes a non-linear sense circuit and the net current after subtraction by the subtractor is converted to time 408 using current controlled delay lines of the non-linear sense circuit. A TDC 410 is implemented in FPGA (similarly implementable in ASIC or others) to count the propagation time of initialized signal "Start", which is controlled by current input from subtractor, until a signal reaches "TDC Stop" as it hops across delay line.

FIG. 4, image (b), shows the nonlinear sensing characteristics of the schematic shown in FIG. 4, image (1). The lower current requirement is particularly useful in neuromorphic computing as a means of implementing inbuilt activation function. An analogy can be made with existing activation functions like softplus as when input current is low the signal takes a long time to propagate via delay lines whereas when input current is high enough then a signal propagates exponentially fast via the delay line, thus encoding activation function in time domain. In FIG. 4, image (b), the solid curve shows the exponential dependency of propagation time on X axis to current on Y axis, whereas linear ADC is shown as the dashed line. The X axis represents the propagation time of the Start signal across the delay line. The Y axis shows the column differential output (current) from subtractor as input to sense circuit—refer to FIG. 3, image (b). The solid curve is fitted to data points measured from the circuit during experiments.

FIG. 5, comprising images (a) to (d), provides the measured output of the current subtractor unit from the PCB. FIG. 5, image (a), is a contour plot of two (skewed) input currents from a pair of columns of the crossbar on the axis, the currents from the pair of columns, current $I_1$ and $I_2$, being injected to the current subtractor, and the color contour shows the arithmetic ideal current subtraction. This is used as a reference to check the output of the subtraction circuit. FIG. 5, image (b), records $I_1$ and $I_2$ on axis, while the color contour shows the measured current subtractor output $I_{out}$ ($I_1-I_2+I_{bias}$, where $I_{bias}$ is the subtractor biasing current, the output being reflected by the shade in the image). To compare the performance of the proposed circuit against the ideal, FIG. 5, image (c), shows the error on the contour plot. The error is defined as difference between the ideal current (by shade) and the measured current from subtractor for a specific $I_1$, $I_2$ pair. It can be seen that the output error is very low for CBA applications, on the order of a few microamps. FIG. 5, image (d), shows the hardware schematic with a pair of columns from CBA connected for input to current subtractor with $I_1$, $I_2$ current, and output as $I_1-I_2+I_{bias}$. This is not the final output from the whole sensing circuit and is later fed to TDC. For this reason, a shunt meter is used to measure the current subtractor output.

Figure 6:
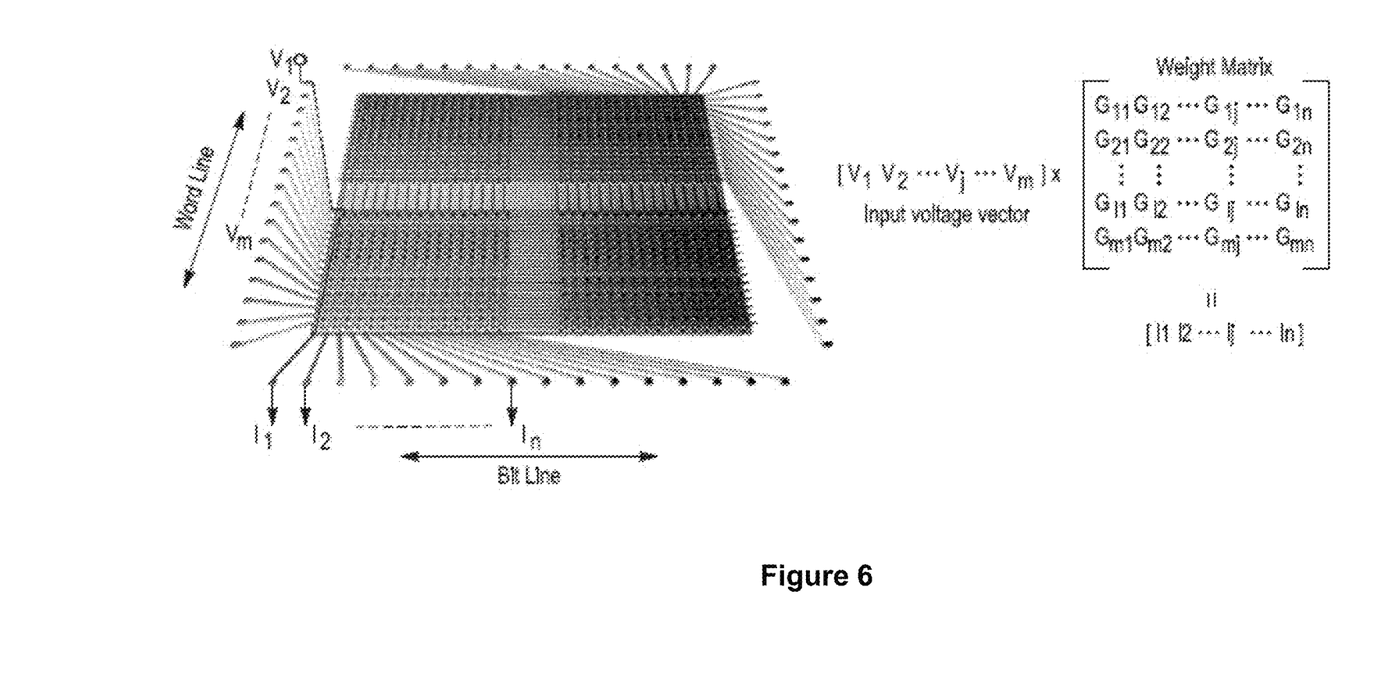
FIG. 6 illustrates an in-memory computing using 1S1R 32×32 array.

The systems and architectures described above have a wide variety of applications. In one embodiment, a Non-von Neumann architecture for in-memory computing is shown in FIG. 6. Using 1S1R (32×32) Memristor crossbar array, vector-matrix multiplication (VMM) is implemented. Mathematically, neuromorphic computing can be decomposed into a series VMM operations. As shown in FIG. 6, when programming some of the Memristors, the selected wordlines (WLs) of the Memristor are applied with input voltage V1, V2, and so on, while rest are floating. Similarly, the bitlines (BLs) of selected cells are grounded. The cells with no input are by default off due to auto select 1S1R structure. In this way, if the WL voltage represents the input and Memristor conductance acts as the weight matrix, the VMM is available as output current summation. The current sensing is done using proposed circuit. For example, a voltage matrix V is applied to the $i^{th}$ row (WL) while the voltage-induced currents of each Memristor are collected at the $j^{th}$ grounded column (BL). A total current of $I_j=\Sigma_i V_i G_{ij}$, is collected by utilizing Ohm's and Kirchhoff's laws.

As shown herein, a device is provided for direct and nonlinear current to time conversion is presented. Such sense circuits particularly have an advantage in CBA architecture for storage and computing as CBA uses current addition and multiplication for operations. The use of the proposed circuit improves power efficiency, latency and sensing margin for current reading.

It will be appreciated that many further modifications and permutations of various aspects of the described embodiments are possible. Accordingly, the described aspects are intended to embrace all such alterations, modifications, and variations that fall within the spirit and scope of the appended claims.

Throughout this specification and the claims which follow, unless the context requires otherwise, the word "comprise", and variations such as "comprises" and "comprising", will be understood to imply the inclusion of a stated integer or step or group of integers or steps but not the exclusion of any other integer or step or group of integers or steps.

The reference in this specification to any prior publication (or information derived from it), or to any matter which is known, is not, and should not be taken as an acknowledgment or admission or any form of suggestion that that prior publication (or information derived from it) or known matter forms part of the common general knowledge in the field of endeavour to which this specification relates.

The invention claimed is:

1. A time-to-digital converter (TDC)-based device comprising:
   a crossbar array for generating a current;
   a current-controlled delay line for converting the current received from the crossbar array into a time pulse; and
   a TDC circuit for measuring and converting the time pulse into digital output,
   wherein the TDC circuit comprises a plurality of sensing circuits,
   wherein each said sensing circuit is configured to control a pair of columns of the crossbar array,
   wherein each said sensing circuit contains a current subtraction unit along with the current-controlled delay line for column differential to increase sensing margin,
   wherein the current subtraction unit is gated and allowed when a start signal is triggered, and
   wherein the propagation of the start signal across the current-controlled delay line is non-linearly related to the current subtracted by the current subtraction unit.

2. The TDC-based device of claim 1, wherein the crossbar array is a 1T1R crossbar or 1S1R crossbar.

3. The TDC-based device of claim 1, wherein the current-controlled delay line comprises cascaded complementary-metal-oxide-semiconductor (CMOS) inverters.

4. A hardware device comprising:
   a time-to-digital converter (TDC)-based device, including:
      a crossbar array for generating a current;
      a current-controlled delay line for converting the current received from the crossbar array into a time pulse; and
      a TDC circuit for measuring and converting the time pulse into digital output,
      wherein the TDC circuit comprises a plurality of sensing circuits,
      wherein each said sensing circuit is configured to control a pair of columns of the crossbar array,
      wherein each said sensing circuit contains a current subtraction unit along with the current-controlled delay line for column differential to increase sensing margin,
      wherein the current subtraction unit is gated and allowed when a start signal is triggered, and
      wherein the propagation of the start signal across the current-controlled delay line is non-linearly related to the current subtracted by the current subtraction unit, and
   a field-programmable gate array (FPGA) or application specific integrated circuit (ASIC) for controlling the TDC circuit of the TDC-based device.

* * * * *